(12) United States Patent
Izumi et al.

(10) Patent No.: US 7,393,763 B2
(45) Date of Patent: Jul. 1, 2008

(54) MANUFACTURING METHOD OF MONOCRYSTALLINE GALLIUM NITRIDE LOCALIZED SUBSTRATE

(75) Inventors: Katsutoshi Izumi, Sakai (JP); Motoi Nakao, Osaka (JP); Yoshiaki Ohbayashi, Nara (JP); Keiji Mine, Yao (JP); Seisaku Hirai, Yao (JP); Fumihiko Jobe, Yao (JP); Tomoyuki Tanaka, Sakai (JP)

(73) Assignees: Osaka Prefecture, Osaka-shi (JP); Hosiden Corporation, Yao-shi (JP)

( * ) Notice: Subject to any disclaimer, the term of this patent is extended or adjusted under 35 U.S.C. 154(b) by 318 days.

(21) Appl. No.: 11/055,985

(22) Filed: Feb. 14, 2005

(65) Prior Publication Data

US 2005/0148108 A1    Jul. 7, 2005

Related U.S. Application Data

(62) Division of application No. 10/699,832, filed on Nov. 4, 2003.

(30) Foreign Application Priority Data

Nov. 25, 2002    (JP) .............................. 2002-341046

(51) Int. Cl.
    *H01L 21/36* (2006.01)
(52) U.S. Cl. ............... 438/481; 438/607; 438/E21.126; 438/E21.407
(58) Field of Classification Search .................. 438/481, 438/607, 41–44, 222–226, 245, 341, 414–415
    See application file for complete search history.

(56) References Cited

U.S. PATENT DOCUMENTS

| | | | |
|---|---|---|---|
| 5,563,428 A | 10/1996 | Ek et al. ....................... 257/77 |
| 6,255,198 B1 | 7/2001 | Linthicum et al. .......... 438/481 |
| 6,423,983 B1 | 7/2002 | Narayan et al. ............... 257/96 |
| 6,606,335 B1 * | 8/2003 | Kuramata et al. ......... 372/45.01 |
| 6,835,966 B2 | 12/2004 | Koide .......................... 257/103 |

FOREIGN PATENT DOCUMENTS

| | | |
|---|---|---|
| JP | 06-326416 A | 11/1994 |
| JP | 8-56015 | 2/1996 |
| JP | 11-274079 A | 10/1999 |
| JP | 2001-044124 A | 2/2001 |
| JP | 2001-168039 A | 6/2001 |
| JP | 2002-246646 A | 8/2002 |

OTHER PUBLICATIONS

Chinese Office action, dated Dec. 8, 2006, with translation.
Notification of Reasons for Refusal received from the Japan Patent Office with English translation dated Feb. 8, 2005.
Chinese Office Action dated Jun. 1, 2007 with English translation.

* cited by examiner

*Primary Examiner*—Dung A. Le
(74) *Attorney, Agent, or Firm*—Kratz, Quintos & Hanson, LLP

(57) ABSTRACT

There is provided a monocrystalline gallium nitride localized substrate suitable for manufacturing electronic-optical united devices in which electronic devices and optical devices are mixedly mounted on the same silicon substrate.

An area in which monocrystalline gallium nitride 410 is grown is locally present on a silicon substrate 100 by forming silicon carbide 200 on the silicon substrate 100 to locally form the monocrystalline gallium nitride 410 on the above-mentioned silicon carbide 200. Silicon nitride 220 is used as a mask in forming the above-mentioned monocrystalline gallium nitride 410.

2 Claims, 2 Drawing Sheets

MANUFACTURING METHOD OF MONOCRYSTALLINE GALLIUM NITRIDE LOCALIZED SUBSTRATE

CROSS REFERENCE TO RELATED APPLICATION

This application is a division of U.S. Ser. No. 10/699,832, filed Nov. 4, 2003, which is based on Japanese Application No. 2002-341046 filed Nov. 25, 2002.

BACKGROUND OF THE INVENTION

1. Field of the Invention

The present invention relates to a monocrystalline gallium nitride localized substrate such that an area in which monocrystalline gallium nitride is grown is locally present on a monocrystalline silicon substrate, and to a manufacturing method thereof.

2. Description of the Related Art

Gallium nitride (GaN) has been generally used as materials for blue light-emitting elements represented by LED (light-emitting diode) and laser diode. Conventionally, sapphire has been mainly used as substrates, and gallium nitride has been grown thereon by the MOCVD method.

Conventionally, electronic devices represented by LSI have been formed on silicon substrates, and the input/output of signals thereof has been performed through electrodes disposed on the periphery of the package or electrodes disposed in an array state on the backside of the package.

These days, the amount of data handled by electronic devices and operation capability required therefor have kept on an increasing course, and the demand for broader band and higher speed on signal transmission on the side of electronic devices has been also increasing. The problem, however, is that signal delay between electronic devices due to metallic wiring and parasitic capacitance occurring between transmission lines and the like. Accordingly, the limitations in the improvement of performance are beginning to appear in the present situation.

For the solutions to the above-mentioned problem, the following methods have been proposed: a method of integrating electronic devices and optical devices by sticking them together on the same substrate, a method of connecting plural electronic devices by optical devices, and the like. However, the former method has the problem such that signal delay is inevitable due to electrical connection between the stuck electronic devices and optical devices, while the latter method has the problem such that it is difficult to downsize the optical devices, and the like.

SUMMARY OF THE INVENTION

The present invention has been created in view of the above-mentioned circumstances, and is intended for providing a monocrystalline gallium nitride localized substrate and a manufacturing method thereof, which is suitable for manufacturing electronic-optical united devices in which electronic devices and optical devices are mixedly mounted on the same silicon substrate.

A monocrystalline gallium nitride localized substrate according to the present invention locally has an area, in which monocrystalline gallium nitride is grown, on a monocrystalline silicon substrate.

Also, a manufacturing method of a monocrystalline gallium nitride localized substrate according to the present invention comprises the step of forming silicon carbide on a monocrystalline silicon substrate and the step of locally forming monocrystalline gallium nitride on the above-mentioned silicon carbide, and employs silicon nitride or silicon oxide as a mask in forming the above-mentioned monocrystalline gallium nitride.

DESCRIPTION OF THE PREFERRED EMBODIMENT

Figure 1:
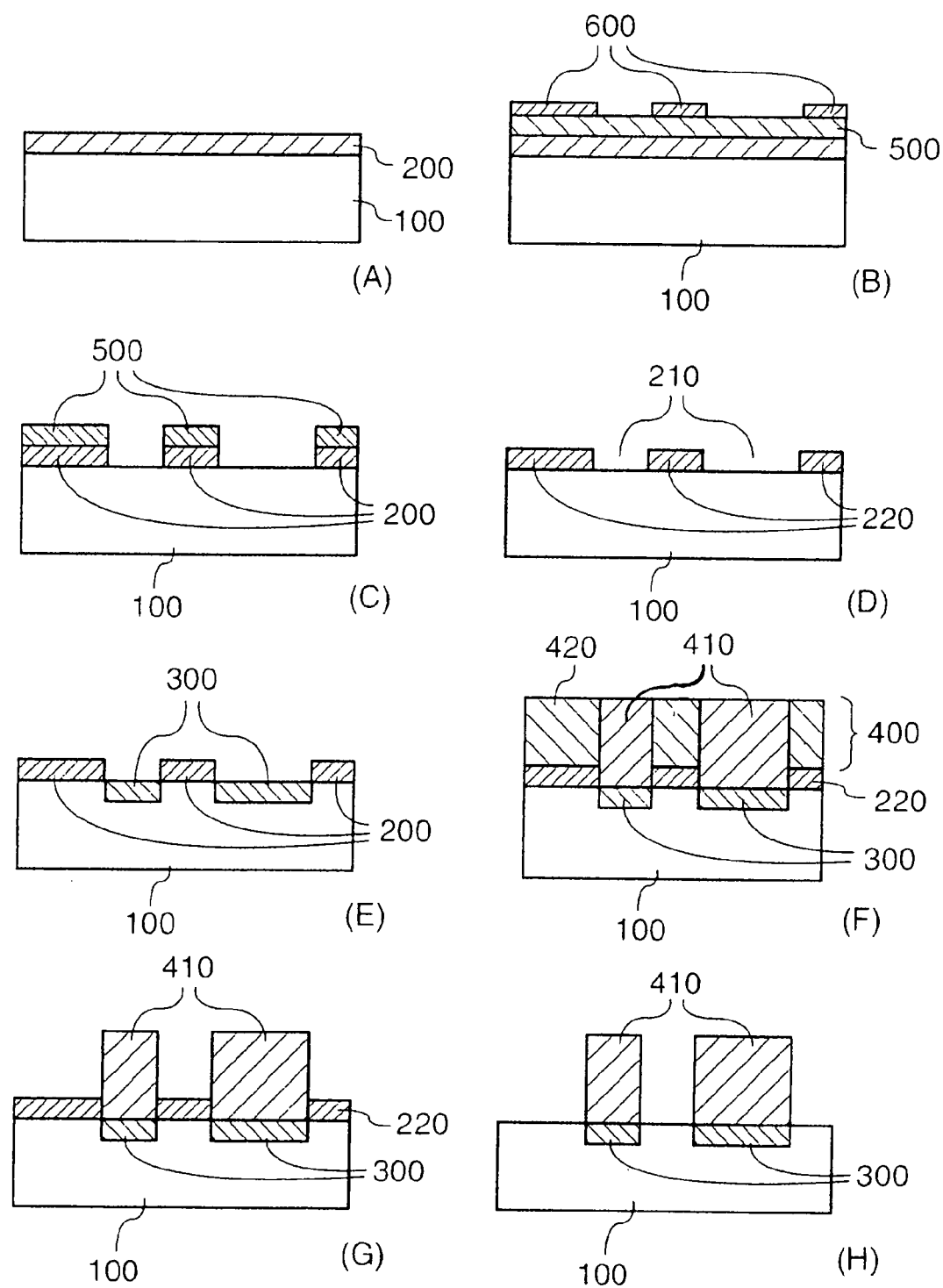
FIG. 1 is a schematic view showing the steps of a manufacturing method of a monocrystalline gallium nitride localized substrate according to Embodiment 1 of the present invention.
Figure 2:
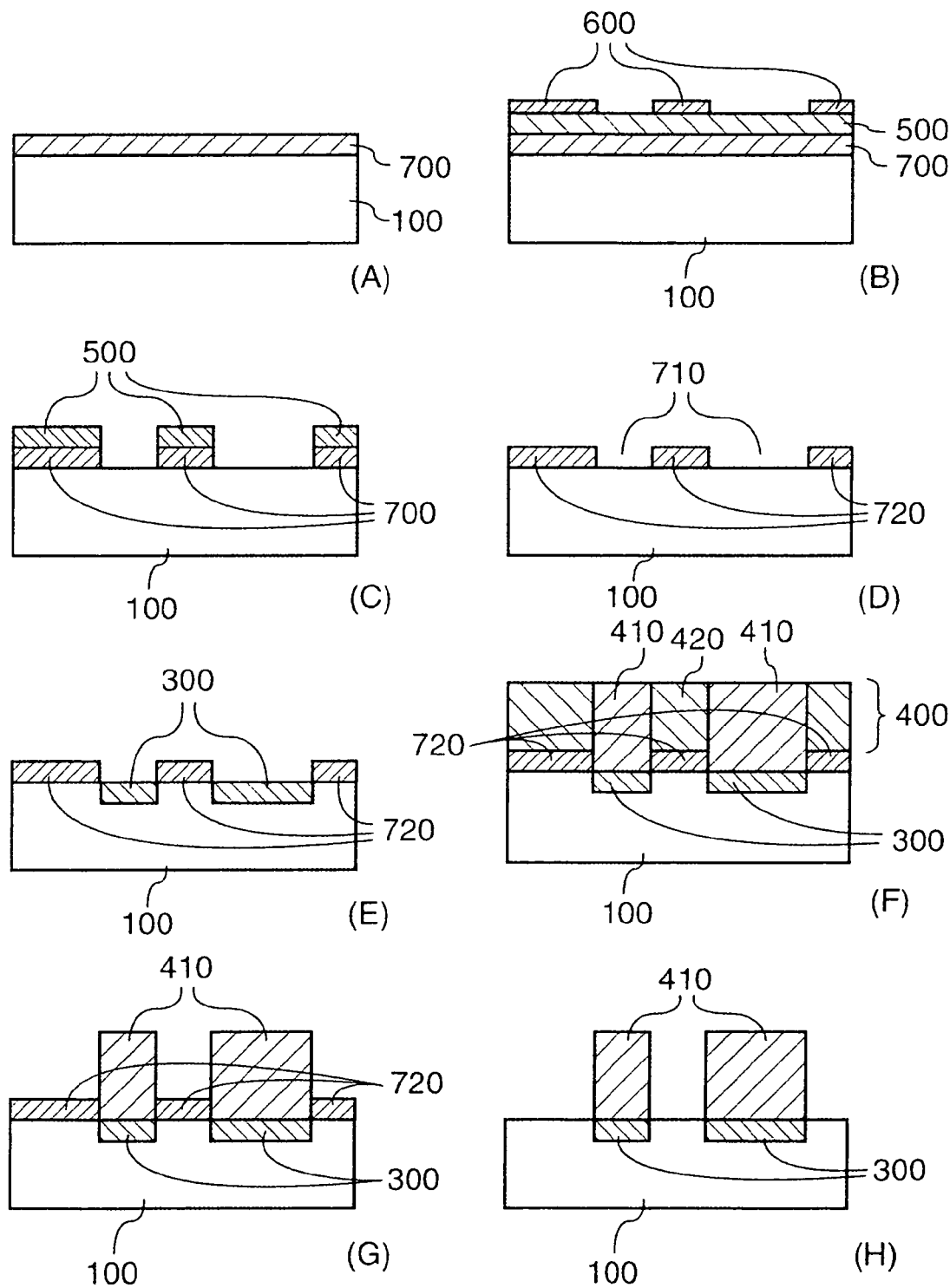
FIG. 2 is a schematic view showing the steps of a manufacturing method of a monocrystalline gallium nitride localized substrate according to Embodiment 2 of the present invention.

FIG. 1 is a schematic view showing the steps of a manufacturing method of a monocrystalline gallium nitride localized substrate according to Embodiment 1 of the present invention, and FIG. 2 is a schematic view showing the steps of a manufacturing method of a monocrystalline gallium nitride localized substrate according to Embodiment 2 of the present invention.

A monocrystalline gallium nitride localized substrate according to Embodiment 1 of the present invention is manufactured in the following manner.

First, silicon nitride ($Si_3N_4$) 200 as a thin film is made to grow by the CVD method on the whole surface of a silicon substrate 100 having a face orientation (111) for film formation (refer to FIG. 1(A)). This silicon nitride 200 functions as a mask in growing gallium nitride 400. That is, the gallium nitride 400 does not grow (does not remain resultingly) in parts in which the silicon nitride 200 is formed.

Next, a photoresist 500 is applied on the silicon nitride 200 to superpose a photomask 600 thereon in areas in which it is undesirable to grow the gallium nitride 400, and the mask pattern is transferred by the photolithography technique (refer to FIG. 1(B)).

The silicon nitride 200 in parts of no photoresist 500 is removed by etching with the use of the developed photoresist 500 as a mask (refer to FIG. 1(C)). The developed photoresist 500 is peeled off so as to expose a part 210 of no silicon nitride 200 and an island-shaped silicon nitride island 220 (refer to FIG. 1(D)). It should be noted that the surface of the silicon substrate 100 as an initial material is exposed in the part 210 of no silicon nitride 200.

Thereafter, the silicon in the part 210 of no silicon nitride 200 is modified into cubic monocrystalline silicon carbide 300 (refer to FIG. 1(E)). Then, the face orientation of the modified monocrystalline silicon carbide 300 is (111), the same as the silicon substrate 100 as an initial material.

The modification of the silicon into the monocrystalline silicon carbide 300 is performed by placing the silicon substrate 100 inside a film-forming chamber and heating the atmosphere temperature of the inside of the film-forming chamber to a temperature of 1200 to 1405° C. while streaming hydrogen gas and hydrocarbon-based gas at a rate of 1 to 5 volume % with respect to the hydrogen gas as carrier gas. Also, the inside of the film-forming chamber is set under atmospheric pressure. It should be noted that the hydrocarbon-based gas involves propane gas, methane gas, ethylene gas, butane gas and the like, and propane gas will be the most excellent in a high content of carbon atom and the lowest cost at the present time as compared with methane gas and ethylene gas.

Subsequently, the gallium nitride 400 is made to epitaxially grow by the MOCVD method on the whole surface of the silicon substrate 100 (refer to FIG. 1(F)). Then, the face orientation of the growing gallium nitride 400 is (0001). There exists the difference in crystallinity between gallium nitride 410 grown on the above-mentioned monocrystalline silicon carbide 300 and gallium nitride 420 grown on the silicon nitride island 220. The gallium nitride 410 grown on the monocrystalline silicon carbide 300 has more favorable crystallinity than the other. This results from the closeness in lattice constant between the (111) face of the monocrystalline silicon carbide 300 and the (0001) face of the gallium nitride 400. On the other hand, the gallium nitride 420 grown on the silicon nitride island 220 becomes polycrystalline, so as to include a great number of crystal defects and have a chemically unstable structure.

The above-mentioned silicon nitride island 220 is provided in areas in which it is undesirable to grow the gallium nitride 400. It is, therefore, required to remove the gallium nitride 420 grown on this silicon nitride island 220.

The removal of this gallium nitride 420 is performed in the following manner. For example, potassium hydroxide is used as etching liquid to soak the whole sample in this etching liquid. This etching liquid is capable of dissolving the gallium nitride 410 grown on the monocrystalline silicon carbide 300 as well; however, the gallium nitride 420 grown on the silicon nitride island 220 is chemically unstable, so that the etching rate thereof is higher than that of the gallium nitride 410 and consequently the gallium nitride 420 grown on the silicon nitride island 220 is selectively etched. Thus, the unnecessary gallium nitride 420 can be removed with a favorable selectivity (refer to FIG. 1(G)).

Next, the silicon nitride island 220 remaining on the surface also after removing the unnecessary gallium nitride 420 is etched by heated phosphoric acid to obtain a monocrystalline gallium nitride localized substrate such that the monocrystalline gallium nitride 410 is locally present (refer to FIG. 1(H)).

Secondly, a manufacturing method of a monocrystalline gallium nitride localized substrate according to Embodiment 2 of the present invention is described referring to FIG. 2.

This manufacturing method is as follows. The surface of a silicon substrate 100 having a face orientation (111) for film formation is thermally oxidized to form silicon oxide ($SiO_2$) 700 as a thin film (refer to FIG. 2(A)). This silicon oxide 700 functions as a mask in growing gallium nitride 400. That is, the gallium nitride 400 does not grow (does not remain resultingly) in parts in which the silicon oxide 700 is formed.

Next, a photoresist 500 is applied on the silicon oxide 700 to superpose a photomask 600 thereon in parts in which it is undesirable to grow the gallium nitride 400, and the mask pattern is transferred by the photolithography technique (refer to FIG. 2(B)).

The silicon oxide 700 in parts of no photoresist 500 is removed by etching with the use of the developed photoresist 500 as a mask (refer to FIG. 2(C)). The developed photoresist 500 is peeled off so as to expose a part 710 of no silicon oxide 700 and an island-shaped silicon oxide island 720 (refer to FIG. 2(D)). It should be noted that the surface of the silicon substrate 100 as an initial material is exposed in the part 710 of no silicon oxide 700.

Thereafter, the silicon of the silicon substrate 100 exposed in the part of no silicon oxide 700 is modified into cubic monocrystalline silicon oxide 300 by the same manner as described in Embodiment 1 (refer to FIG. 2(E)). The modification of the silicon into the monocrystalline silicon carbide 300 is performed by the same manner as described above, namely, by placing the silicon substrate 100 inside a film-forming chamber and heating the atmosphere temperature of the inside of the film-forming chamber to a temperature of 1200 to 1405° C. while streaming hydrogen gas and hydrocarbon-based gas such as propane gas, methane gas, ethylene gas and butane gas at a rate of 1 to 5 volume % with respect to the hydrogen gas as carrier gas. Also, the inside of the film-forming chamber is set under atmospheric pressure.

The face orientation of the modified monocrystalline silicon carbide 300 is also (111), the same as the initial silicon substrate 100.

Next, the gallium nitride 400 is made to epitaxially grow by the MOCVD method on the whole silicon substrate 100 (refer to FIG. 2(F)). Then, the face orientation of the growing gallium nitride 400 is (0001). There exists the difference in crystallinity between gallium nitride 410 grown on the above-mentioned monocrystalline silicon carbide 300 and gallium nitride 420 grown on the silicon oxide island 720. The gallium nitride 410 grown on the monocrystalline silicon carbide 300 has more favorable crystallinity than the other. This results from the closeness in lattice constant between the (111) face of the monocrystalline silicon carbide 300 and the (0001) face of the gallium nitride 400. On the other hand, the gallium nitride 420 grown on the silicon oxide island 720 includes a great number of crystal defects, so as to have a chemically unstable structure.

The silicon oxide island 720 is provided in parts in which it is undesirable to grow the gallium nitride 400, so that it is required to remove the gallium nitride 420 grown on the silicon oxide island 720.

The removal of this gallium nitride 420 is performed in the following manner. For example, potassium hydroxide is used as etching liquid to soak the whole sample in this etching liquid. This etching liquid is capable of dissolving the gallium nitride 410 grown on the monocrystalline silicon carbide 300 as well; however, the gallium nitride 420 grown on the silicon oxide island 720 is chemically unstable, so that the etching rate thereof is higher than that of the gallium nitride 410 and consequently the gallium nitride 420 grown on the silicon oxide island 720 is selectively etched. Thus, the unnecessary gallium nitride 420 can be removed with a favorable selectivity.

Next, the silicon oxide island 720 remaining on the surface is etched by heated hydrofluoric acid-based etching liquid (refer to FIG. 2(G)) to obtain a monocrystalline gallium nitride localized substrate such that the monocrystalline gallium nitride 410 is locally present (refer to FIG. 2(H)).

It should be noted that the silicon substrate 100 is used as an initial material in the above-mentioned Embodiments 1 and 2, and a monocrystalline gallium nitride localized substrate which is equivalent thereto can be manufactured also by using an SOI substrate instead through similar steps.

A monocrystalline gallium nitride localized substrate according to the present invention locally has an area, in which monocrystalline gallium nitride is grown, on a monocrystalline silicon substrate.

Such a monocrystalline gallium nitride localized substrate does not cause the problem of signal delay by forming optical devices such as LED and laser diode and electronic devices in parts thereon in which monocrystalline gallium nitride is formed and parts thereon in which monocrystalline gallium nitride is not formed respectively, as compared with products by a conventional method of sticking electronic devices and optical devices together. Also, the monocrystalline gallium nitride localized substrate can solve the problem of downsizing optical devices caused in a method of connecting electronic devices by optical devices.

What is claimed is:

1. A method of manufacturing a monocrystalline gallium nitride localized substrate comprising the steps of:
   growing silicon nitride on a surface of a monocrystalline silicon substrate;
   applying a photoresist on the silicon nitride;
   superposing a photomask on the photoresist and developing the photoresist;
   etching the silicon nitride using the photoresist as a mask;
   peeling off the developed photoresist;
   thereafter, carbonizing an area of the surface of the monocrystalline silicon substrate into monocrystalline silicon carbide, the area having no silicon nitride,
   growing gallium nitride on the silicon nitride and on the monocrystalline silicon carbide;
   thereafter, selectively etching the gallium nitride on the surface of the silicon nitride by wet etching so as to etch the remaining gallium nitride on the surface of the silicon nitride.

2. A method of manufacturing a monocrystalline gallium nitride localized substrate according to claim 1, wherein the monocrystalline silicon substrate comprises an SOI substrate.

* * * * *